US006963298B2

(12) United States Patent
Otsuka et al.

(10) Patent No.: US 6,963,298 B2
(45) Date of Patent: Nov. 8, 2005

(54) ANALOG TO DIGITAL CONVERTER WITH VOLTAGE COMPARATORS THAT COMPARE A REFERENCE VOLTAGE WITH VOLTAGES AT CONNECTION POINTS ON A RESISTOR LADDER

(75) Inventors: Masanori Otsuka, Tachikawa (JP); Kazuo Yamakido, Nishitama (JP); Etsuji Yamamoto, Tachikawa (JP); Shinya Sano, Kodaiara (JP)

(73) Assignees: Renesas Technology Corp., Tokyo (JP); Hitachi ULSI Systems Co., Ltd., Tokyo (JP)

( * ) Notice: Subject to any disclaimer, the term of this patent is extended or adjusted under 35 U.S.C. 154(b) by 86 days.

(21) Appl. No.: 10/152,638

(22) Filed: May 23, 2002

(65) Prior Publication Data

US 2003/0043066 A1 Mar. 6, 2003

(30) Foreign Application Priority Data

Aug. 30, 2001 (JP) ........................................ 2001-261111

(51) Int. Cl.[7] ................................................ H03M 1/12
(52) U.S. Cl. ....................................... 341/155; 341/156
(58) Field of Search ................................ 341/155, 156, 341/133, 172, 160, 118, 103, 159, 161

(56) References Cited

U.S. PATENT DOCUMENTS 5,757,303 A * 5/1998 Nakatani et al. ............ 341/159
5,815,106 A * 9/1998 Poss et al. .................. 341/159
5,867,116 A * 2/1999 Nakamura et al. .......... 341/159
5,877,718 A * 3/1999 Andoh et al. .............. 341/155
6,002,356 A * 12/1999 Cooper ...................... 341/159
6,091,346 A * 7/2000 Muresan et al. ............ 341/155
6,114,982 A * 9/2000 Hardy et al. ................ 341/155
6,232,908 B1 * 5/2001 Nakaigawa ................. 341/155

OTHER PUBLICATIONS

Y. Tamba et al., "A CMOS 6b 500M Sample/s ADC for a Hard Disk Drive Read Channel," 1999 IEEE Solid–State Circuits Conference, Feb. 17, 1999, pp. 324–325.

P. Scholtens, "A 2.5 Volt 6 bit 600MS/s Flash ADC in 0.25μm CMOS," 2000 European Solid State Circuits Conference, pp. 196–199.

* cited by examiner

*Primary Examiner*—Michael Tokar
*Assistant Examiner*—Lam T. Mai
(74) *Attorney, Agent, or Firm*—Miles & Stockbridge P.C.

(57) ABSTRACT

An AD converter which uses no buffer for receiving the input signals or uses the buffer having relaxed requirements concerning the range of input signals and the output impedance. Voltage at the connection points of a resistor ladder in which a plurality of resistor elements are connected in series, are compared with a reference voltage by a plurality of voltage comparators, a first current circuit is provided on the high potential side of the resistor ladder, a second current circuit is provided on the low potential side thereof, and analog input voltages are fed by providing an input terminal at any place of the resistor ladder except both ends thereof.

10 Claims, 13 Drawing Sheets

ANALOG TO DIGITAL CONVERTER WITH VOLTAGE COMPARATORS THAT COMPARE A REFERENCE VOLTAGE WITH VOLTAGES AT CONNECTION POINTS ON A RESISTOR LADDER

BACKGROUND OF THE INVENTION

1. Field of the Invention

This invention relates to an AD (analog to digital) converter. More specifically, the invention relates to technology that can be effectively utilized for a parallel comparison (flash) type analog to digital converter.

2. Description of the Related Art

An HDD (hard disk drive) and a DVD (digital versatile disk) have now been widely used as a data storage or as a dynamic image medium in personal computers. Such disk data storage systems can roughly be divided into those based on analog signal processing and those based on digital signal processing for reading out the signals recorded in the disk. The latter system reproduces, based on the digital signal processing, the initial data sequence from the signals that are taken in by using a magnetic head or an optical pickup while removing such effects as interference among the codes.

Therefore, the signals read out from the disk are, first, converted into digital signals through an analog to digital (AD) converter. The AD converter used therefor requires a resolution of about 6 bits and a sampling rate which is as high as several hundreds of MHz, which is still on the increase. In addition, wide-band characteristics of about ¼ the sampling frequencies are generally required.

As flash (parallel comparison) type AD converters designed for high-speed operation, there have been proposed "A CMOS 6b 500M sample/s ADC for Hard Disk Drive Read Channel" IEEE, 1999, International Solid State Circuits Conference, pp. 324–325, Y. Tamba et al (hereinafter referred to as literature 1) and "A 2.5 Volt 6 bit 600 MS/s Flush ADC in 0.25 $\mu$m CMOS", 2000, European Solid State Circuits Conference, pp. 196–199, P. Scholtens et al. (literature 2).

When the AD converter has a resolution of n bits, a flash-type AD converter usually comprises a group of resistors (resistor ladder) of a number of n-th power of 2 ($2^n$), a group of voltage comparators of a number of n-th power of 2 minus 1 ($2^n-1$), and an encoder. There are obtained a group of reference voltages by dividing a reference voltage that is input by the resistor ladder, and comparator output signals of a number of n-th power of 2 minus 1 by simultaneously comparing the input voltages by using the group of voltage comparators. With the comparator in which the input signal becomes closest to the reference voltage as a boundary, the comparator output signals become "1" when the input reference voltages are low, and become "0" when the input reference voltages are high. These signals are called "thermometer codes". The encoder is a circuit for obtaining a binary signal of n bits from the thermometer code signals of the number of n-th power of 2 minus 1.

The voltage comparator compares the magnitudes of the input signal and of the i-th reference voltage Vrefi (i is a natural number of n-th power of 1 or 2 minus 1). The same result is obtained even by judging, in its place, the positive polarity or the negative polarity of a differential voltage between the input signal Vin and the reference voltage Vrefi. That is, $$?(Vin>Vrefi)=?(Vin-Vrefi>0) \quad (1)$$

Here, "?(a>b)" is to judge the truth in parenthesis, i.e., to judge whether a is greater than b. The AD converter of the above literature 2 is based on this idea.

In the comparator operation of the flash-type AD converter, an importance resides near the transition point (decision point) in the result of judgement by the voltage comparator. In this portion, a difference in the input voltage of the voltage comparator decreases, and there distinctly appears imperfectness in the characteristics, such as lack of gain of the voltage comparator and offset. When the above-mentioned generally constituted flash-type AD converter is taken into consideration, the decision points become the reference voltages Vrefi input to the voltage comparators and differ depending upon the comparators. If the voltage comparators are not designed for each of the input reference voltages Vrefi, the operation range must be broadened so as to permit the operation over the whole range of input voltages, resulting in an increase in the scale of the circuit and an increase in the consumption of electric power. In the AD converter based on the modification (Vin−Vrefi>0) of the above formula (1), on the other hand, the voltage comparator needs judge only the 0-cross of voltage, i.e., whether the voltage is positive or negative. Therefore, what is required for the voltage comparator is the same irrespective of the voltage comparators in the group, and the above-mentioned problem is solved.

In the AD converter of the above literature 2, however, the direct current flowing through the ladder resistors flows into, or flows out from, the analog signal input terminal due to its constitution. The AD converter must possess an input impedance which is sufficiently large so that the AD converter itself will not become a load to the preceding stage. The AD converter of the literature 2 must have an input buffer for increasing the input impedance. The buffer must possess a current drive ability while maintaining a signal band of several hundreds of MHz. The buffer must further satisfy various requirements such as low output impedance, low offset and low distortion. When the output impedance is not sufficiently low, further, there occurs distortion due to dependency of the output impedance upon the output voltage, though the distortion due to the buffer itself may be small.

Further, the AD converter of the literature 2 has a problem concerning the range of the analog input signals. The input signal to the AD converter is set to be, generally, near one-half the power source voltage by taking the dynamic range and the operation margin of the circuit into consideration. In the AD converter of the above literature, however, it is difficult to set the input voltage to be one-half the power source voltage due to its constitution, and the input voltage must be set being deviated toward either the power source side or the ground side. Therefore, limitation is imposed on the maximum amplitude of the input signals, which is disadvantageous from the standpoint of signal to noise ratio (S/N ratio). An increase in the amplitude causes a distortion.

SUMMARY OF THE INVENTION

The present invention, therefore, provides an AD converter which does not use a buffer for receiving the input signals, or which uses a buffer having loose requirements concerning the range of input signals and output impedance. The invention, further, provides an AD converter which consumes less electric power, features a small circuit scale, and realizes a high-speed operation.

Among the inventions disclosed in this application, a representative example will now be briefly described. Voltages at the connection points of a resistor ladder in which a plurality of resistor elements are connected in series, are compared with a reference voltage by a plurality of voltage comparators, a first current circuit is provided on the high potential side of the resistor ladder, a second current circuit is provided on the low potential side thereof, and analog input voltages are fed by providing an input terminal at any place of the resistor ladder except both ends thereof.

The above and other objects as well as novel features of the invention will become obvious from the description of the specification and the accompanying drawings.

DETAILED DESCRIPTION OF THE PREFERRED EMBODIMENTS

Figure 1:
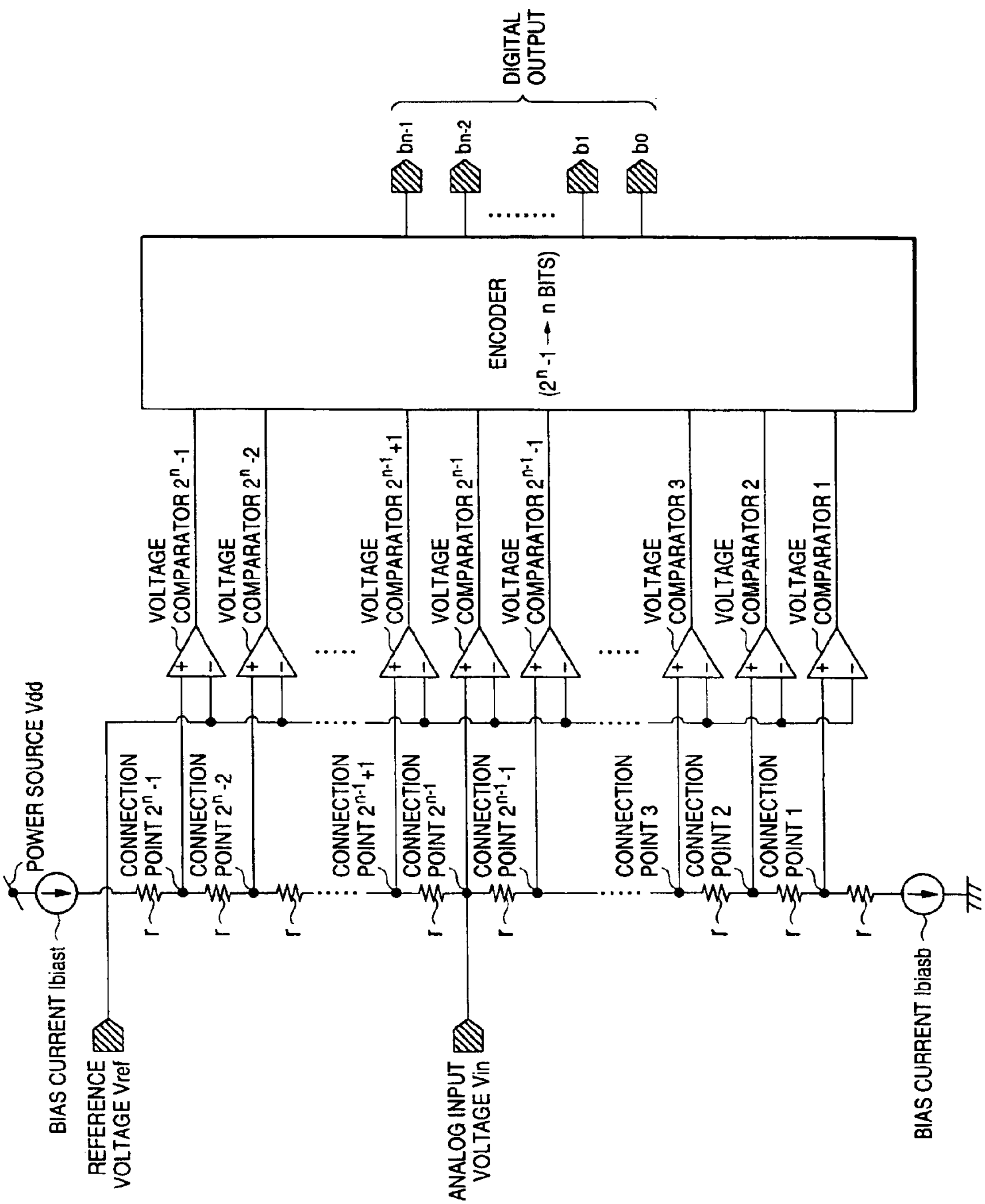
FIG. 1 is a circuit diagram illustrating an embodiment of a flash-type AD converter according to the invention.

FIG. 1 is a circuit diagram illustrating an embodiment of a flash-type AD converter according to the invention. Though there is no particular limitation, the circuit elements and the circuit blocks are formed on a semiconductor substrate as represented by a single crystalline silicon by a known technology for producing CMOS semiconductor integrated circuits.

In this embodiment, when the AD converter has a resolution of n bits, there is provided a resistor ladder having $2^n$ resistors having a resistance r. The letter "r" represents the resistance as described above and further represents a unit of resistance element that constitutes the resistor ladder. Though there is no particular limitation, a blow-out type (source type) constant-current circuit (first current circuit) constituted by a current mirror circuit is provided at an upper end (high potential side) of the resistor ladder, and a suction type (sink type) constant-current circuit (second current circuit) constituted by a current mirror circuit is provided at a lower end (low potential side) of the resistor ladder. The blow-out type constant-current circuit feeds a bias current Ibiast from the upper end side of the resistor ladder, and the suction type constant-current circuit sucks a bias current Ibiasb on the lower end side of the resistor ladder. The two bias currents are set to be Ibiast=Ibiasb by current mirror circuits that will be described later.

There are connection points where the unit resistor elements r of a number of $2^n$ are connected to each other (hereinafter referred to as connection points) in a number of $(2^n-1)$ as represented by connection point 1, connection point 2, connection point 3, - - - , connection point $2^{n-1}-1$, connection point $2^{n-1}$, connection point $2^{n-1}+1$, - - - , connection point $2^n-2$, and connection point $2^n-1$ in FIG. 1. Voltage comparators are provided for each of these connection points. Therefore, there are the voltage comparators in a number of $(2^n-1)$. Voltages of the connection point 1 through up to the connection point $2^n-1$ are fed to the positive phase (non-inverted) inputs (+) of the voltage comparators 1 to the voltage comparators $2^n-1$. A reference voltage Vref is fed in common to the negative phase (inverted) inputs (−) of the voltage comparators. Though there is no particular limitation, the connection point $2^{n-1}$ at the center of the resistor ladder serves as an analog input voltage terminal to which an analog input voltage Vin is fed.

The output signals of the voltage comparator 1 through up to the voltage comparator $2^n-1$ are fed to the encoder which is represented as a black box where thermometer code signals of a number of $2^n-1$ are converted into n-bit binary signals b0 to bn−1.

In the AD converter of this embodiment, the voltages at the connection points of the resistor ladder are found as described below. As a bias current Ibias which makes the current Ibiast of the high potential side constant-current circuit equal to the current Ibiasb of the low potential side constant-current circuit, the potentials at the connection points of the resistor ladder assume values equal to the analog input voltage Vin to which are added voltages increased by the resistors or voltages decreased by the resistors; i.e., It can be understood that the operation complies with the formula (1) if a portion where "input voltage+comparison voltage" is regarded to be "input voltage−(−comparison voltage)" and if the polarities of the terms on the right side of the formula (2) are judged.

For the purpose of comparison, the flash-type AD converter disclosed in the literature 2 will now be discussed. The AD converter of the literature 2 forms a differential voltage between the input signal and the reference voltage based upon the above formula (1) and judges whether it is positive. In the AD converter of the literature 2, a constant-current source is connected to one side of the resistor ladder, and the input voltage is added to the other side thereof. The input terminals (e.g., +) on the one side of the voltage comparators are connected to the connection points of the resistor ladder, and the input terminals (e.g., −) on the other side of the voltage comparators are connected to the reference voltage Vref. The reference voltage Vref serves as a criterion for judging whether the voltage is positive or negative. This voltage serves as the decision point (judging point) for all comparators.

Briefly described below is the AD conversion operation taught in the literature 2. When the analog input voltage is denoted by Vin, bias current of the resistor ladder, i.e., current of the constant-current circuit is denoted by Ibias, and resistance of the ladder by r, then, Potential at connection point 1=$Vin+1\cdot Ibias\cdot r$ Potential at connection point 2=$Vin+2\cdot Ibias\cdot r$ Potential at connection point $2^{n-1}$=$Vin+2^{n-1}\cdot Ibias\cdot r$ Potential at connection point $2^{n-1}-1$=$Vin+(2^{n-1}-1)\cdot Ibias\cdot r$ (3)

In either case, the formula is "input voltage+comparison voltage", and it will be understood that the operation complies with the formula (1) if it is regarded to be "input voltage −(−comparison voltage)" and if the polarity thereof is judged. When the reference voltage Vref is $2^{n-1}\cdot$Ibias·r, then, the input voltages of the comparators become as follows, i.e., differences between the + side terminal voltages and the − side terminal voltages of the comparators become as follows:

Comparators:

$$\text{First input voltage} = Vin + 1\cdot Ibias\cdot r - 2^{n-1}\cdot Ibias\cdot r = Vin + (1-2^{n-1})\cdot Ibias\cdot r \quad (4)$$

$$\text{Second input voltage} = Vin + 2\cdot Ibias\cdot r - 2^{n-1}\cdot Ibias\cdot r = Vin + (2-2^{n-1})\cdot Ibias\cdot r$$

$$2^{n-1}\text{ input voltage} = Vin + 2^{n-1}\cdot Ibias\cdot r - 2^{n-1}\cdot Ibias\cdot r = Vin$$

$$2^{n-1}+1\text{ input voltage} = Vin + 2^{n-1}+1\cdot Ibias\cdot r - 2^{n-1}\cdot Ibias\cdot r = Vin + Ibias\cdot r$$

$$2^{n-1}-1\text{ input voltage} = Vin + (2^{n}-1)\cdot Ibias\cdot r - 2^{n-1}\cdot Ibias\cdot r = Vin + (2^{n}-1)\cdot Ibias\cdot r$$

to the analog input signal voltage Vin in the comparator at the center of the ladder. At other places, the input voltages become equal to Vin from which a voltage an integer times as great as Ibias·r is subtracted, or to which a voltage an integer times as great as Ibias·r is added.

Through the study conducted by the present inventors, it was learned that the AD converter of the literature 2 constituted as described above involve the following problems (1) to (4) as described above.

(1) The direct current Ibias flowing through the ladder resistor flows into the analog input terminal.

(2) The input voltage range of the AD converter is deviated. That is, it is not allowed to set the center voltage to be one-half the power source voltage.

(3) Since the input terminal exists at an end of the ladder resistor, a delay occurs at the other end due to a time constant of the resistance and a parasitic capacitance, and a waveform is distorted when high-speed signals are input.

(4) When an input buffer is added to avoid the problem (1) above, the output impedance thereof is distorted and the characteristics are affected such as being offset.

Concerning the above problem (1), it is desired that the input terminal of the AD converter has a high input impedance.

In this constitution, however, the bias current Ibias of the resistor ladder has nowhere to go except the analog input terminal. Therefore, a circuit preceding the AD converter feeds this current. Namely, the circuit in the preceding stage must suck the bias current Ibias. To avoid this, an input buffer must be provided. The input buffer must be capable of feeding the bias current Ibias and must, further, have a wide band with low distortion.

Concerning the above problem (2), the range of input signals to the AD converter usually has a center voltage which is selected to be one-half the power source voltage to maintain a margin in the operation and to permit the input of signals having larger amplitudes. In the AD converter of the literature 2, however, the range of input signals must be set being deviated toward the low voltage side. First, the low voltage side is considered in the range of input signals. If the input range of the voltage comparator is neglected, 0 V which is the lowest voltage of the circuit can be input. On the high voltage side, on the other hand, there arouses the following limitation. The voltage at the upper end of the resistor ladder becomes equal to the input voltage Vin to which $2^{n}\cdot$Ibias·r is added. Further, a voltage large enough carrying out the operation must be applied to the constant-current circuit connected to the upper end of the ladder.

When this voltage is denoted by Vb, a relationship between this voltage and the analog input voltage Vin is expressed by the following formula, with the power source voltage as Vdd, $$Vdd \geqq Vb + Ibias\cdot r\cdot 2^{n} + Vin \quad (5)$$

where the inequality sign means that if this formula is satisfied, a sufficiently large voltage is applied to every circuit, and a desired operation can be expected.

The above formula (5) can be modified as given below to also express limitation on the low power source voltage side, $$Vdd - Vb - Ibias\cdot r\cdot 2^{n} + \geqq Vin \geqq 0.0 \quad (6)$$

When the power source voltage Vdd is sufficiently high, the input voltage Vin can be set to be nearly one-half the power source voltage while satisfying the above formula (6), which, however, becomes difficult to accomplish when the power source voltage is low.

As an example, if Vdd=3.0 V, Vb=0.3 V and Ibias·r·$2^{n}$=1.5 V, then, $$1.5\ V \geqq Vin \geqq 0.0\ V \quad (7)$$

whereby the center voltage of the signals becomes 0.75 V, and cannot be set to be one-half the power source voltage, i.e., to be 1.5 V. In practice, the range becomes narrower than the one expressed by the above formula (6) due to limitation on the range of input voltages of the voltage comparators as described above.

The conditions can be relaxed if the signal amplitude is decreased, i.e., if the voltage Ibias·r·$2^{n}$ is decreased. However, a decrease in the amplitude of the input signals deteriorates the signal to noise ratio (S/N ratio) determined by the ratio of the amplitude of the signal and the amplitude of noise, and is not desirable.

Concerning the above problem (3), when the frequency of the input signals increases, i.e., when the input signals change to assume a high speed, there arouses a problem in that a change in the connection points (connection points $2^{n}-1$, $2^{n}-2$, - - - ) separated away from the input terminal in the resistor ladder cannot catch up the input signals. This is because the time constants at the connection points determined by the resistance from the input terminal, parasitic capacitance of the resistor, and the total capacitance of input capacitances of the voltage comparators, increase as they go away from the input terminal. There exists limitation on decreasing the parasitic capacitances of the resistors and on decreasing the input capacitances of the comparators. Therefore, the unit resistance r of the resistor ladder must be decreased. The minimum resolution of the AD converter is a product Ibias·r of the current of the ladder and the unit resistance. When it is attempted to decrease the resistance of the resistor r while maintaining the minimum resolution constant, however, the current Ibias must be increased, resulting in an increase in the consumption of electric power.

Concerning the above problem (4), in the AD converter of the literature 2, the output of the input buffer affects the conversion characteristics. The output portion of the input buffer can be equivalently expressed by an ideal signal source having a zero internal resistance and by an internal resistance ro connected in series therewith. Therefore, the input voltage Vx at the output terminal of the input buffer is expressed as, $$Vx=Vin+Ibias\cdot ro \tag{8}$$

It will thus be learned that the potentials at the connection points are deviated by a predetermined value Ibias·ro through the input buffer. This could become a factor of offset of the AD converter. Though ro was handled as a constant in the above formula, the output impedance of the amplifier, in general, varies depending upon the output voltage. Therefore, the shift voltage Ibias·ro of the above formula (8) varies depending upon the input voltage. This could become a cause of distortion in the conversion characteristics.

In order to solve the above problems, it becomes necessary to increase the voltage gain of the OP amplifier and to lower the output impedance to a sufficient degree when the input buffer is of the voltage follower type using an OP amplifier. When the input buffer is of the source follower type of MOS transistors, the mutual conductance gm of the MOS transistors forming the source follower must be increased since an inverse number of the mutual conductance gm is an output resistance. Since the mutual conductance gm varies in proportion to the transistor size (gate width) or the square root of the current, it becomes necessary to increase the current or to increase the size of the element, causing an increase in the scale of the circuit due to an increase in the consumption of electric power and due to the use of large elements.

Figure 2:
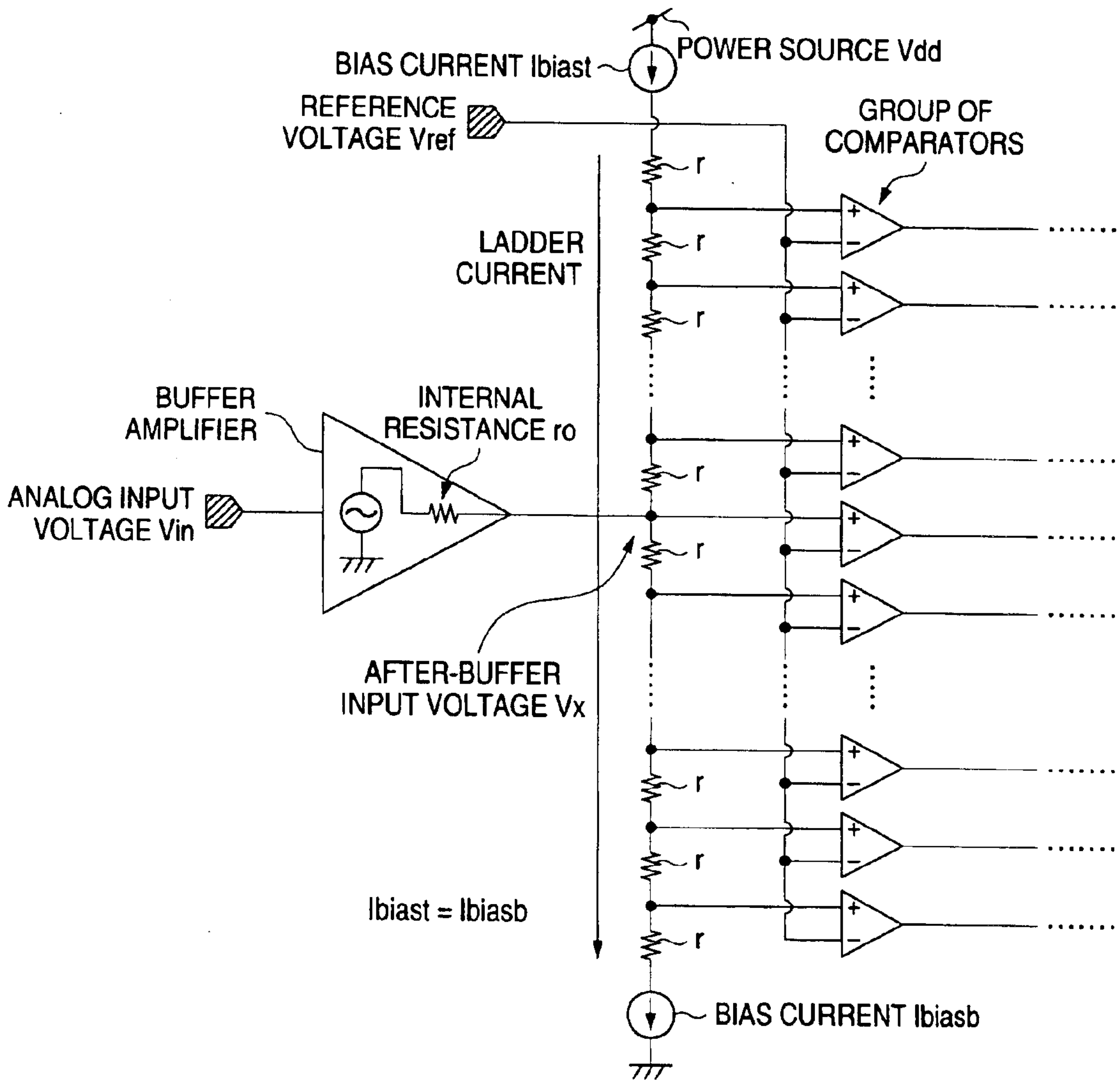
FIG. 2 is a diagram of an equivalent circuit of the AD converter of FIG. 1.

Described below is how the four problems possessed by the above constitution of the AD converter of the literature 2 turn out in the constitution of this invention. FIG. 2 is a diagram illustrating an equivalent circuit of an AD converter according to this invention.

Concerning the above problem (1), the constitution of the AD converter of this invention permits no direct current to flow into the input terminals which are the connection points of the resistor ladder so far as the current values Ibiast and Ibiasb of the constant-current circuits attached to both ends of the resistor ladder are in agreement as shown in the diagram of an equivalent circuit of FIG. 2. Only AC (alternating) components that charge/discharge parasitic capacitances of the connection points of the resistor ladder flow into, and out of, the input terminals. Even upon omitting the input buffer (buffer amplifier) as shown in FIG. 2, therefore, it is considered that the operation can be accomplished like in the embodiment of FIG. 1. Even when the input buffer is added as shown, further, the AC components only may be brought into consideration. Therefore, the buffer needs possess a smaller driving ability than that of the constitution of the AD converter of the literature 2. A circuit for precisely bringing the current values Ibiast and Ibiasb of the two constant-current circuits into agreement will be described later.

Concerning the above problem (2), in the AD converter of this invention, the connection point for connecting the input terminal may be any one in the resistor ladder except the ends of the resistor ladder as shown in the literature 2. If the connection point is selected at the center, however, a maximum of signal amplitude can be input even at a low power source voltage yet maintaining an operation margin of the circuit, which is desirable. Even when the center of the input voltage of the AD converter is deviated due to some reasons, any connection point of the resistor ladder constituted by the invention serves as an input terminal, giving such an advantage that there is no need of using a DC level shift circuit that is usually used in such cases.

Concerning the above problem (3), the frequency of input signals is limited by the resistance from the input terminal and by the parasitic capacitance at the connection point as described above. In this invention, the input terminal is set at the center of the resistor ladder, so that a maximum resistance from the input terminal is decreased into one-half, i.e., from $r\cdot 2^n$ to $r\cdot 2^{n-1}$. Thus, the band is widened without increasing the consumption of electric power.

Concerning the above problem (4), Vin becomes equal to Vx since the current flowing through the resistor ladder does not flow into, or out of, the input buffer amplifier as shown the diagram of an equivalent circuit of FIG. 2. Therefore, the potentials at the connection points of the resistor ladder are not affected by the output impedance ro as represented by the above formula (8). This means that the internal resistance ro of the input buffer amplifier needs not be decreased. Accordingly, the buffer amplifier can be set so as to possess low performance. This enables the buffer to operate at high speeds and at high frequencies while consuming decreased amounts of electric power.

Figure 3:
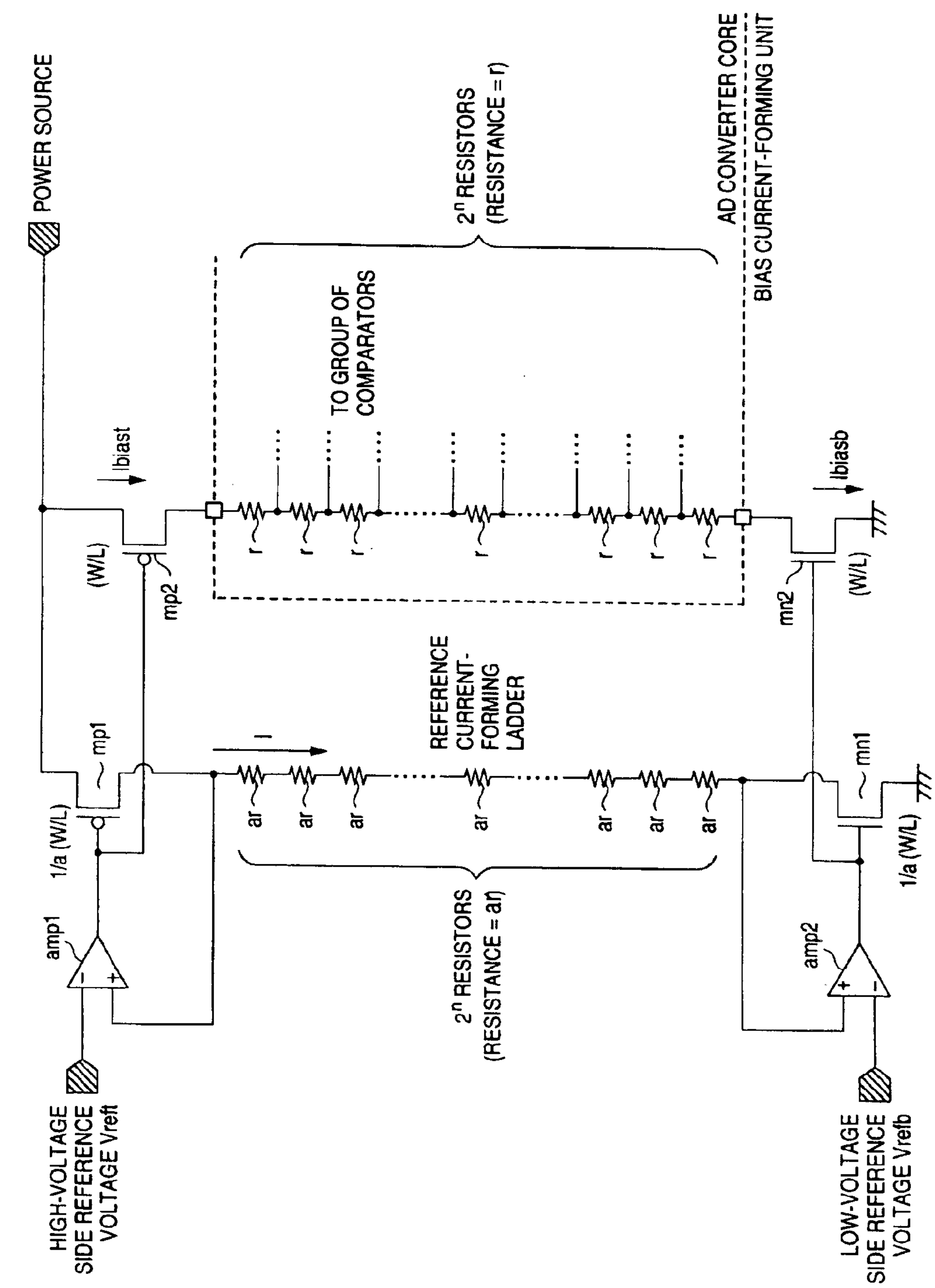
FIG. 3 is a circuit diagram of an embodiment of a resistor ladder bias current generating circuit used in the invention.

FIG. 3 is a circuit diagram of an embodiment of a resistor ladder bias current generating circuit used in the invention. In the AD converter circuit of this invention, the circuits that generate current biases Ibiast and Ibiasb for the resistor ladder are important blocks that determine the overall characteristics. When these currents are not in agreement, a differential current flows into the input terminal of the AD converter as described above, and the conversion characteristics become nonlinear. Further, when the constant-current characteristics of the constant-current circuits are not sufficiently large (output impedances are not sufficiently large), the characteristics lose linearity, too. This is because the bias current changes due to a change in the input signals.

This embodiment deals with the resistor ladder bias current generating circuit corresponding to the constitution in which the input voltage range of the AD converter is specified by using two reference voltages Vreft and Vrefb. In this embodiment, two resistor ladders are provided. Of these two resistor ladders, the resistor ladder of the left side is for forming the reference current and the resistor ladder of the right side serves as real constituent elements of the AD converter.

Voltages applied by the two amplifiers amp1 and amp2 to the resistor ladder on the side of forming the reference current, are Vreft at the upper end and Vrefb at the lower end. Namely, the reference voltage Vreft of the high voltage side is fed to an inverted input (−) of the amplifier amp1, an output voltage thereof is fed to the gate of a p-channel MOS transistor mp1, and a drain output of the MOS transistor mp1 is fed back to a non-inverted input (+) of the amplifier amp1.

Therefore, the amplifier amp1 and the MOS transistor mp1 constitute a voltage follower circuit which so works that the reference voltage Vreft of the high voltage side fed to the inverted input (−) of the amplifier amp1 becomes equal to the voltage at the non-inverted input (+) of the amplifier amp1, and the upper end of the resistor ladder assumes Vreft. Similarly, the amplifier amp2 and the MOS transistor mn1 constitute a voltage follower circuit which so works that the reference voltage Vrefb of the low voltage side fed to the inverted input (−) of the amplifier amp2 becomes equal to the voltage at the non-inverted input (+) of the amplifier amp2, and the lower end of the resistor ladder assumes Vrefb.

The resistor ladder is provided between the voltage Vreft and the voltage Vrefb, and the current I of the resistor ladder of the left side becomes, $$I=(Vreft-Vrefb)/(a\cdot r\cdot 2^n) \quad (9)$$

The bias current of the resistor ladder on the right side used for the AD converter becomes a times as great as that of the resistor ladder on the left side, since a current mirror circuit is formed by the MOS transistors mp1, mp2 and by the MOS transistors mn1, mn2, and the ratio of MOS sizes in the current mirror circuit is 1/a:1. This is because, the current on the left side for forming the reference is set to be 1/a as compared to the current of the ladder (right side) of the AD converter, to suppress the overall consumption of electric current. If a=1, then, the current is the same between the right ladder and the left ladder.

The constant-current characteristics are deteriorated chiefly by the channel length modulation of the MOS transistors. To improve this, the gate lengths of the MOS transistors mp1, mp2, mn1 and mn2 may be lengthened, or the current mirror circuit may be constituted in cascade.

Though there is no particular limitation, the resistor ladder bias current generating circuits shown in FIG. 3 can be utilized as circuits for generating bias currents Ibiast and Ibiasb of FIGS. 1, 2, 4 to 6, and 8 to 10.

Figure 4:
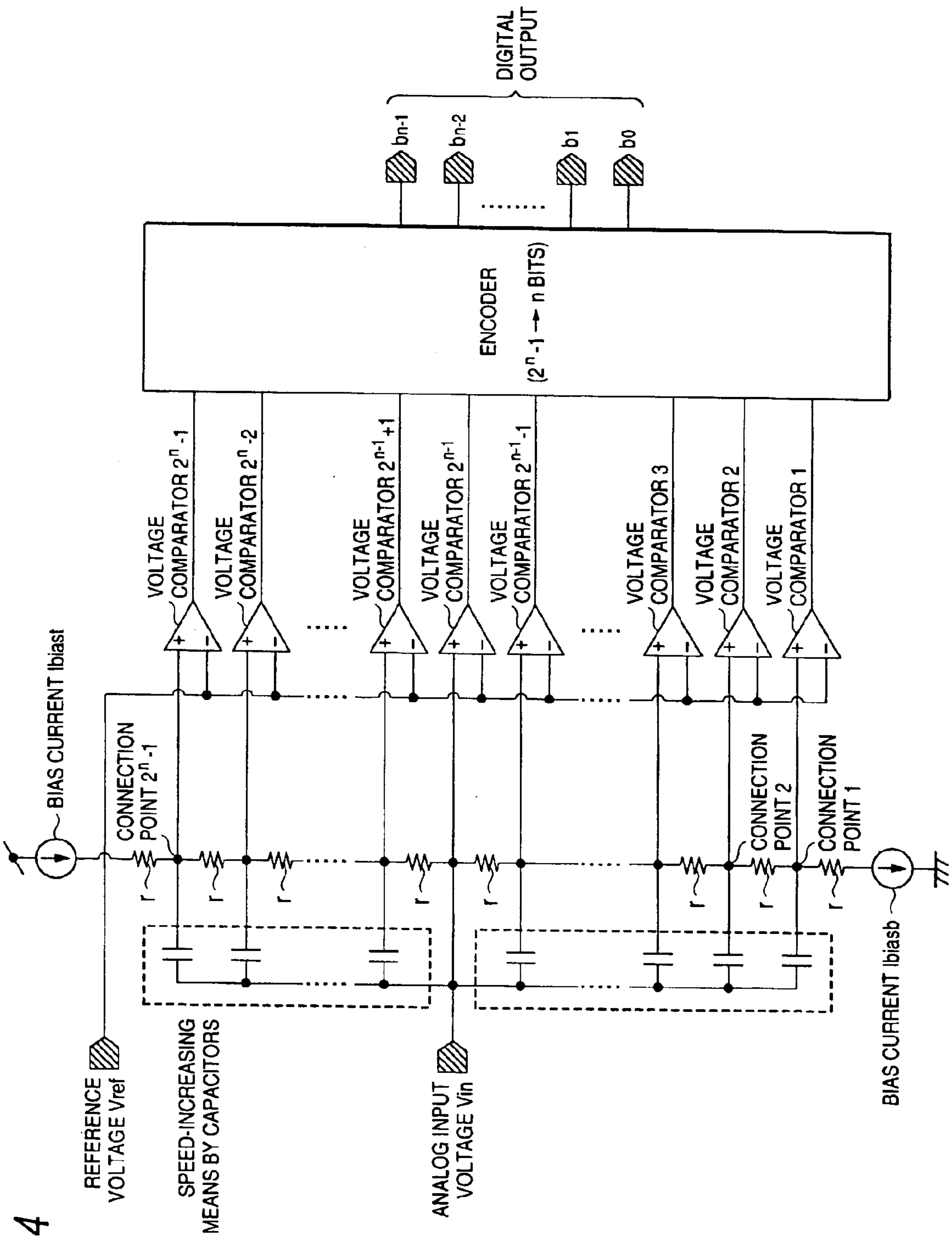
FIG. 4 is a circuit diagram illustrating another embodiment of the flash-type AD converter according to the invention.

FIG. 4 is a circuit diagram illustrating another embodiment of the flash-type AD converter according to the invention. In this embodiment, a high-speed means is added. As described concerning the problem (3) above, the time constants at the connection points of the resistor ladder are imposing limitation on the frequency of input signals. To solve this problem in this embodiment, the connection points are connected to the input terminal which receives analog input voltages Vin through elements (capacitors) that permit the passage of AC components only. This quickens a change in the signals even at the connection points remote from the input terminal, enabling the band of input signals to be widened.

Considering from the principle, the additional capacitors need not necessarily be provided for all connection points, but may be provided for the connection points remote from the input terminal, such as connection point $2^n-1$, connection point $2^n-2$, connection point 1 and connection point 2 in FIG. 4 to efficiently exhibit the effect. Though there is no particular limitation, these capacitors may utilize gate capacities of MOS transistors or may be formed by the capacitor elements formed among the wirings by utilizing the multi-layer wiring technology. Though there is no particular limitation, the capacitor elements among the wirings can be formed by a first wiring to which the analog input voltage Vin is applied, a second wiring coupled to the connection points of the resistor elements, and insulating films formed at predetermined portions where the first wiring and the second wiring cross each other.

Figure 5:
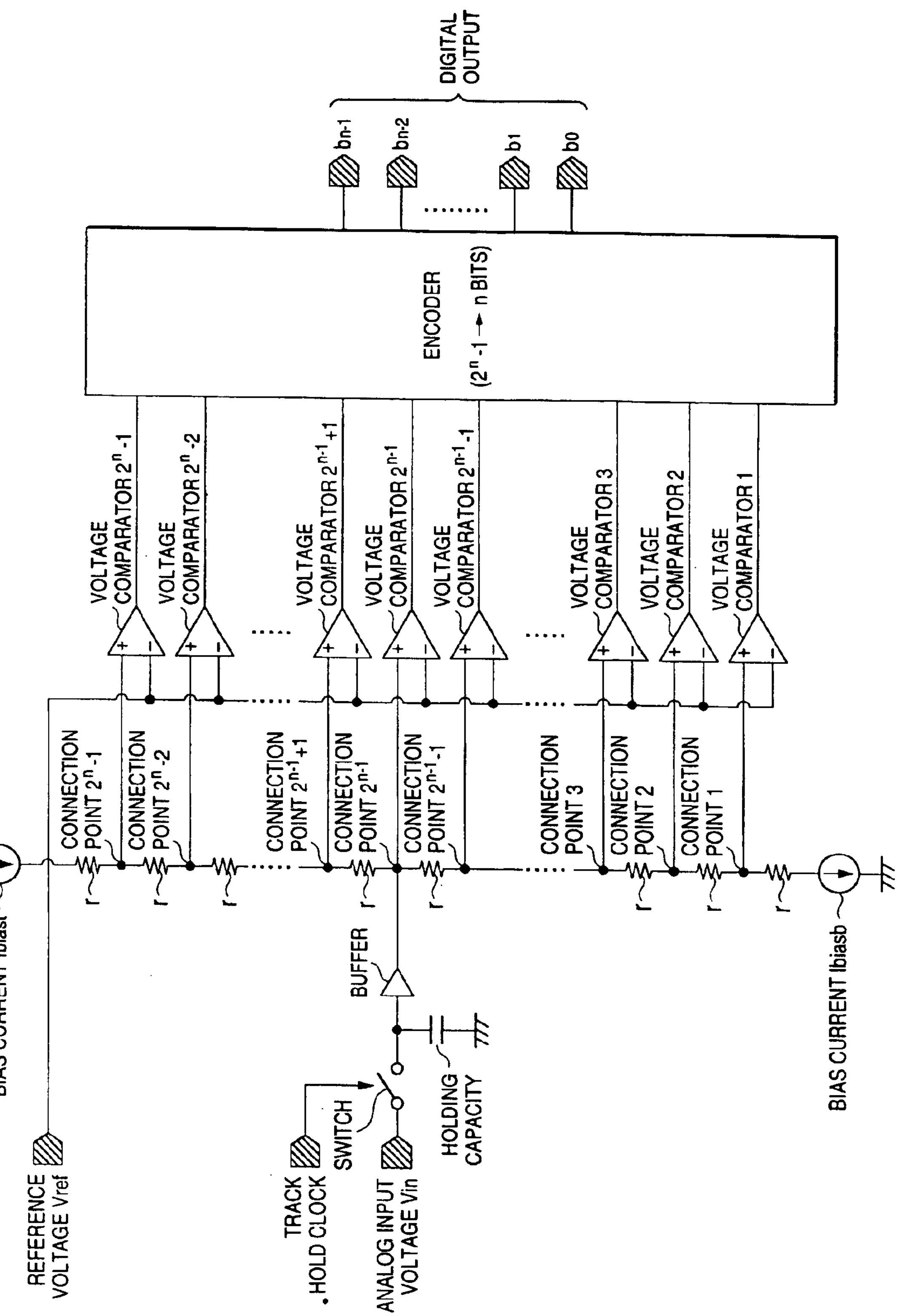
FIG. 5 is a circuit diagram illustrating a further embodiment of the flash-type AD converter according to the invention.

FIG. 5 is a circuit diagram illustrating a further embodiment of the flash-type AD converter according to the invention. In this embodiment, a track-holding circuit or a sample-holding circuit is added. The flash-type AD converter does not essentially require the track-holding circuit. When high-speed input signals are to be handled, however, deviation in the comparison timing of the voltage comparator becomes no longer negligible due to clock skew. Therefore, the track-holding circuit is often added. The track-holding (sample-holding) circuit of this embodiment is constituted by a buffer, a switch provided on the input side thereof and by a holding capacity.

When a track hold clock is on one level, the switch is turned on, and the analog input voltage Vin is input to the holding capacity. As the track hold level changes into other level, the switch is turned off, and the analog input voltage Vin that is taken in is held by the holding capacity. In this state, the comparison output of the voltage comparator is decoded to obtain a stable AD converted output.

Figure 6:
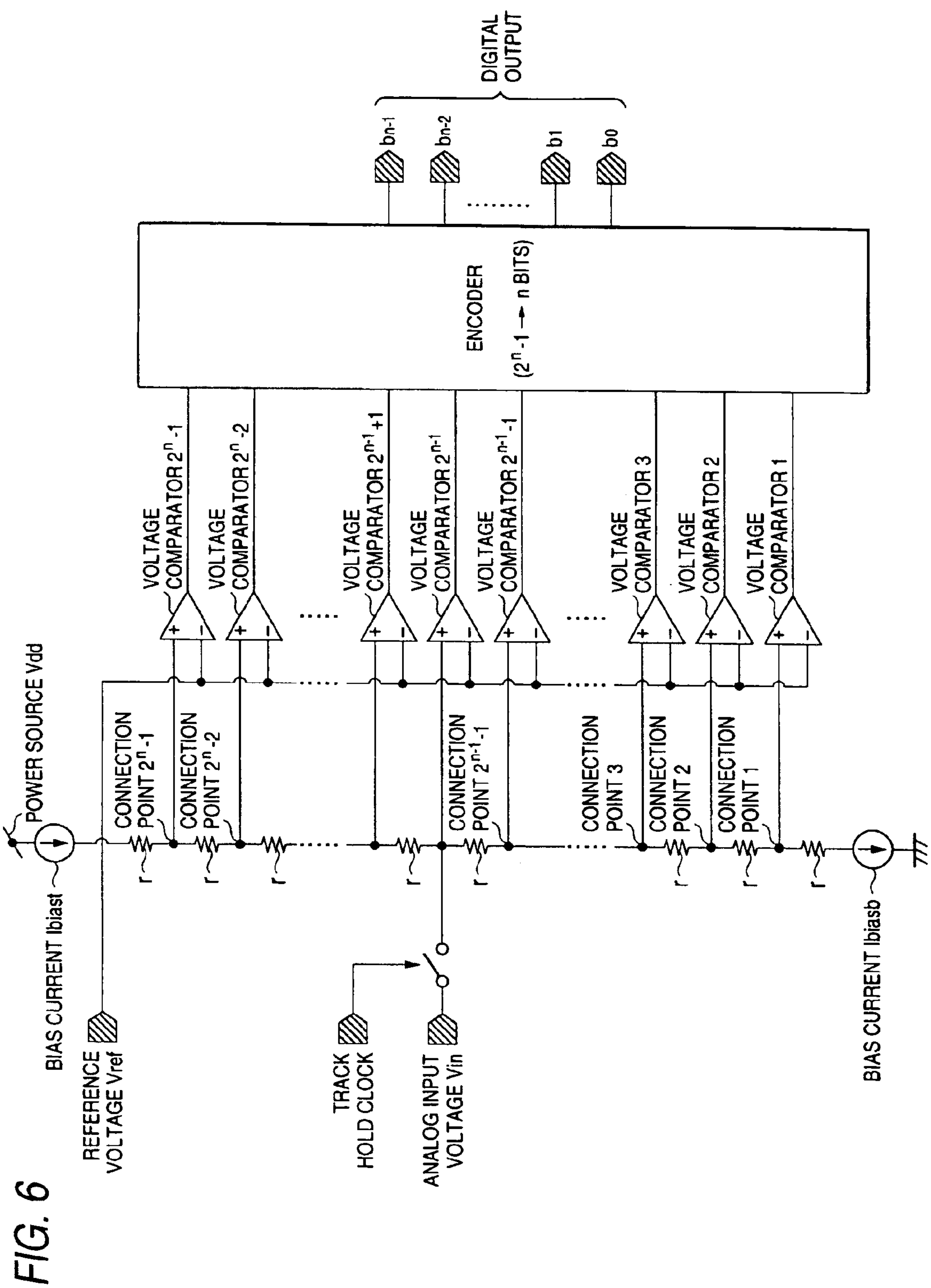
FIG. 6 is a circuit diagram illustrating a still further embodiment of the flash-type AD converter according to the invention.

FIG. 6 is a circuit diagram illustrating a still further embodiment of the flash-type AD converter according to the invention. In this embodiment, too, a track-holding circuit or a sample-holding circuit is added. In this embodiment, the parasitic capacitances at the connection points of the resistor ladder are utilized as holding capacities, and the analog input voltage Vin is fed to the input terminal via the switch which is controlled by the track hold clock. This makes it possible to omit the holding capacity and the buffer.

Figure 7:
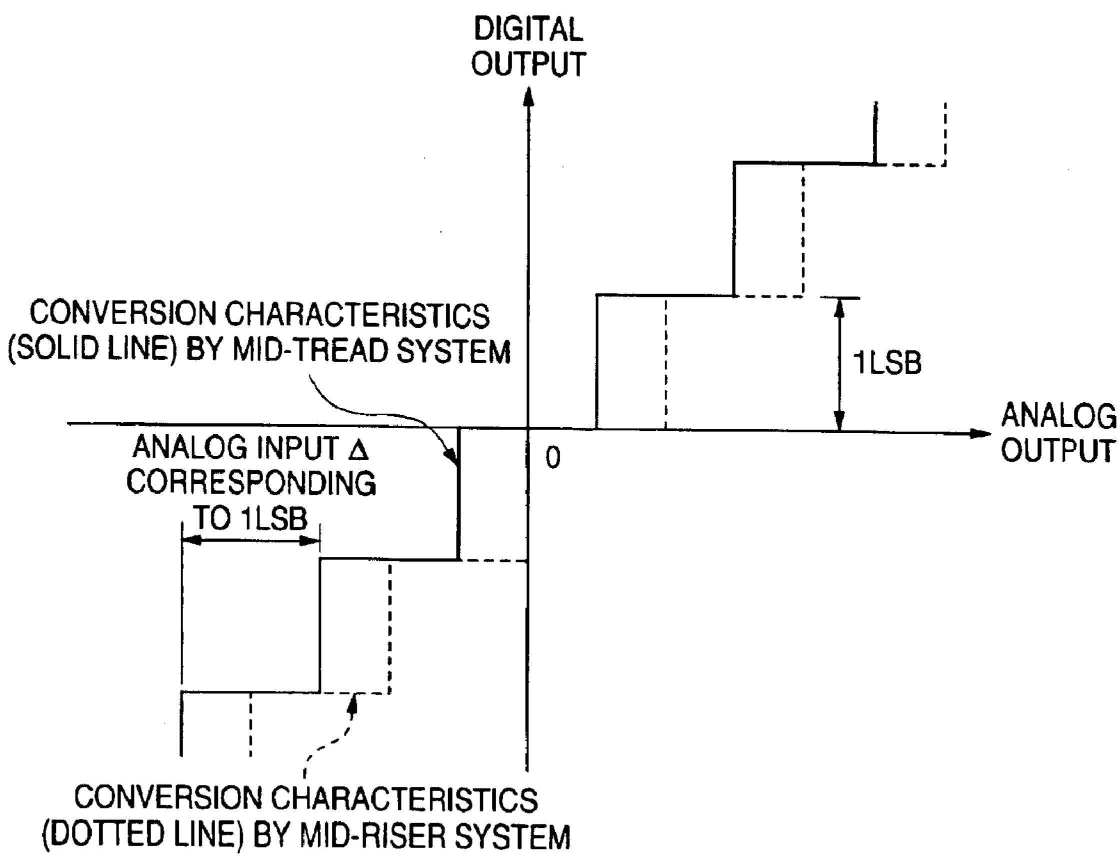
FIG. 7 is a diagram illustrating input/output characteristics of the AD converter.

FIG. 7 is a diagram illustrating input/output characteristics of the AD converter. The conversion characteristics of the AD converter can be classified into two, i.e., the analog input/digital output characteristics can be classified into two as represented by the input/output characteristics shown in FIG. 7 depending upon the 0-cross handling of the analog inputs. In FIG. 7, the abscissa represents analog signals which are the inputs to the AD converter, and the ordinate represents digital codes which are the outputs, thus representing conversion characteristics of the AD converter. As the analog input voltage changes by $\Delta$, the digital code changes by 1 LSB. In a system called mid-riser represented by broken lines in FIG. 7, the digital code shifts when the analog input is 0 and is an integer times of $\Delta$. In a system called mid-tread, on the other hand, the output code is 0 when the analog input is 0. The transition point is expressed by $\pm(2n+2)\Delta/2$, where n is a natural number (0, 1, 2, - - - ).

In general, the mid-riser system is selected in many times. In this system, when the signal is 0, the output digital code undergoes a change due to disturbance such as noise since the real input to the AD converter fluctuates around 0. In the expression of the complementary of 2, "0" and "−1" of the decimal notation are "000 - - - 000" and "111 - - - 111", respectively. When the input varies near 0, the whole bits repeat the inversion. In the mid-tread system, on the other hand, the output of the AD converter remains "000 - - - 000" and does not change unless the magnitude of disturbance exceeds $\Delta/2$.

Figure 8:
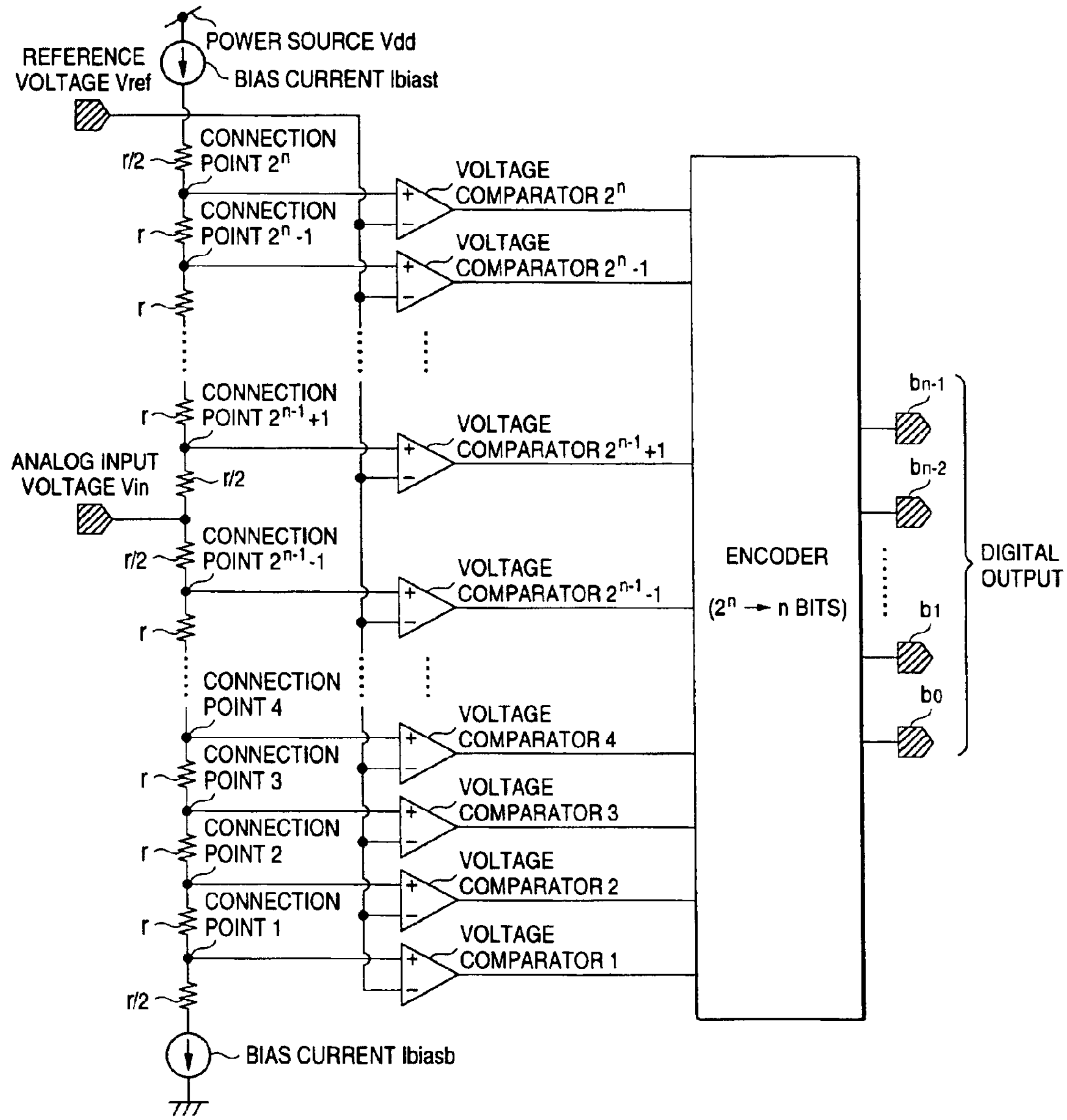
FIG. 8 is a circuit diagram illustrating another embodiment of the flash-type AD converter according to the invention.

FIG. 8 is a circuit diagram illustrating another embodiment of the flash-type AD converter according to the invention. The AD converter of this embodiment is designed for use with the mid-tread system described above. The AD converters shown in FIGS. 1, 4 and 5 are for use with the mid-riser system. The mid-tread system needs the comparators in a number of $2^n$ which is larger by 1 than that of the mid-riser system.

The resistor ladder of this embodiment is provided at both ends thereof with resistor elements having a resistance r/2 which is one-half the resistance of the unit resistor element r. The input terminal that receives the analog input voltage Vin is not provided at the connection point that connects the unit resistor elements r to each other, but is provided at a point where the unit resistor element r is divided into r/2 as described above. In the example of FIG. 8, the input terminal is provided at a connection point at where the unit resistor element between the connection point $2^{n-1}$ and the connection point $2^{n-1}+1$ is divided into r/2.

Figure 9:
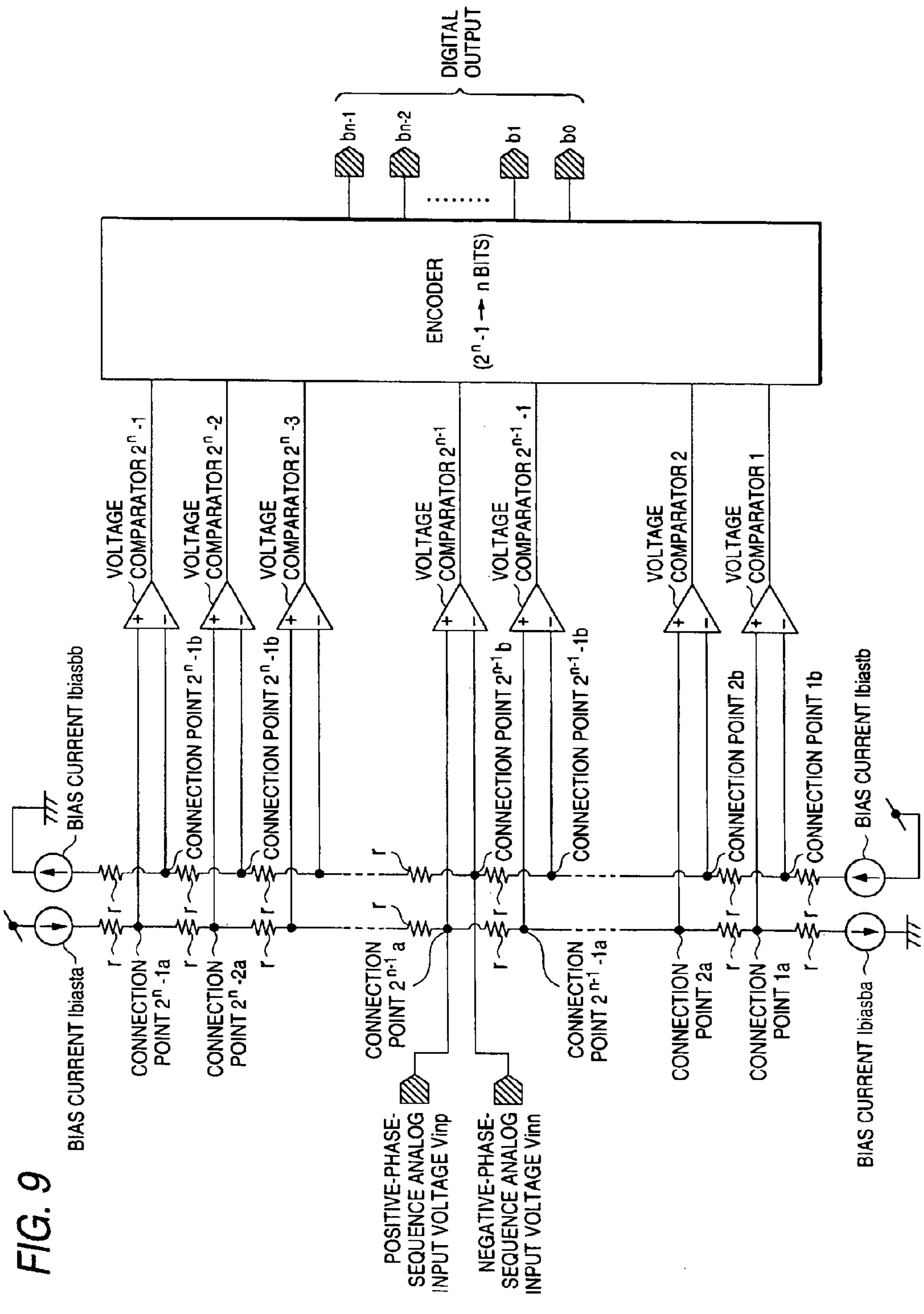
FIG. 9 is a circuit diagram illustrating a further embodiment of the flash-type AD converter according to the invention.

FIG. 9 is a circuit diagram illustrating a further embodiment of the flash-type AD converter according to the invention. The AD converter of this embodiment is of the perfectly differential flash-type. This embodiment is to perfectly differentiate the constitution (single-end constitution) of the embodiment of FIG. 1. The completely differential constitution is immune to external noise such as noise from a digital circuit, and is often used for analog-digital hybrid ICs such as AD converters and DA converters.

In the completely differential AD converter of this embodiment, when the resolution is n bits, provision is made of two resistor ladders having resistors of a number of n-th power of 2 ($2^n$) and voltage comparators of a number of n-th power of 2 ($2^n$) or of a number of n-th power of 2 minus 1 ($2^n-1$), and wherein blow-out type constant-current circuits such as current mirrors are provided at the upper ends (high potential side) of the resistor ladders, and suction type constant-current circuits such as current mirrors are provided at the lower ends (low potential side) of the resistor ladders. In FIG. 9, the high potential side and the low potential side of the two resistor ladders are shown in a reversed manner. Therefore, the bias currents are flowing into the two resistor ladders in the reverse directions in FIG. 9.

In FIG. 9, a positive-phase analog input voltage Vinp is fed to the input terminal provided at a connection point $2^{n-1}$ a of the one resistor ladder, and a negative-phase analog input voltage Vinn is fed to the input terminal provided at a connection point $2^{n-1}$ b of the other resistor ladder. The voltage comparators are to compare the voltages at the connection points of the resistor ladder of the positive-phase side with the voltages of the connection points that are symmetrical to the neutral point of the ladder of the negative-phase side. For example, a voltage comparator 1 compares the connection point 1a corresponding to the lowest voltage of the resistor ladder of the positive-phase side with the connection point 1b corresponding to the highest voltage of the resistor ladder of the negative-phase side. A voltage comparator 2 compares the connection point 2a corresponding to the second lowest voltage of the resistor ladder of the positive-phase side with the connection point 2b corresponding to the second highest voltage of the resistor ladder of the negative-phase side. The operation and effect of the AD converter of this embodiment will now be described in relation to the operation of the AD converter that was discussed above prior to describing the present invention.

Figure 12:
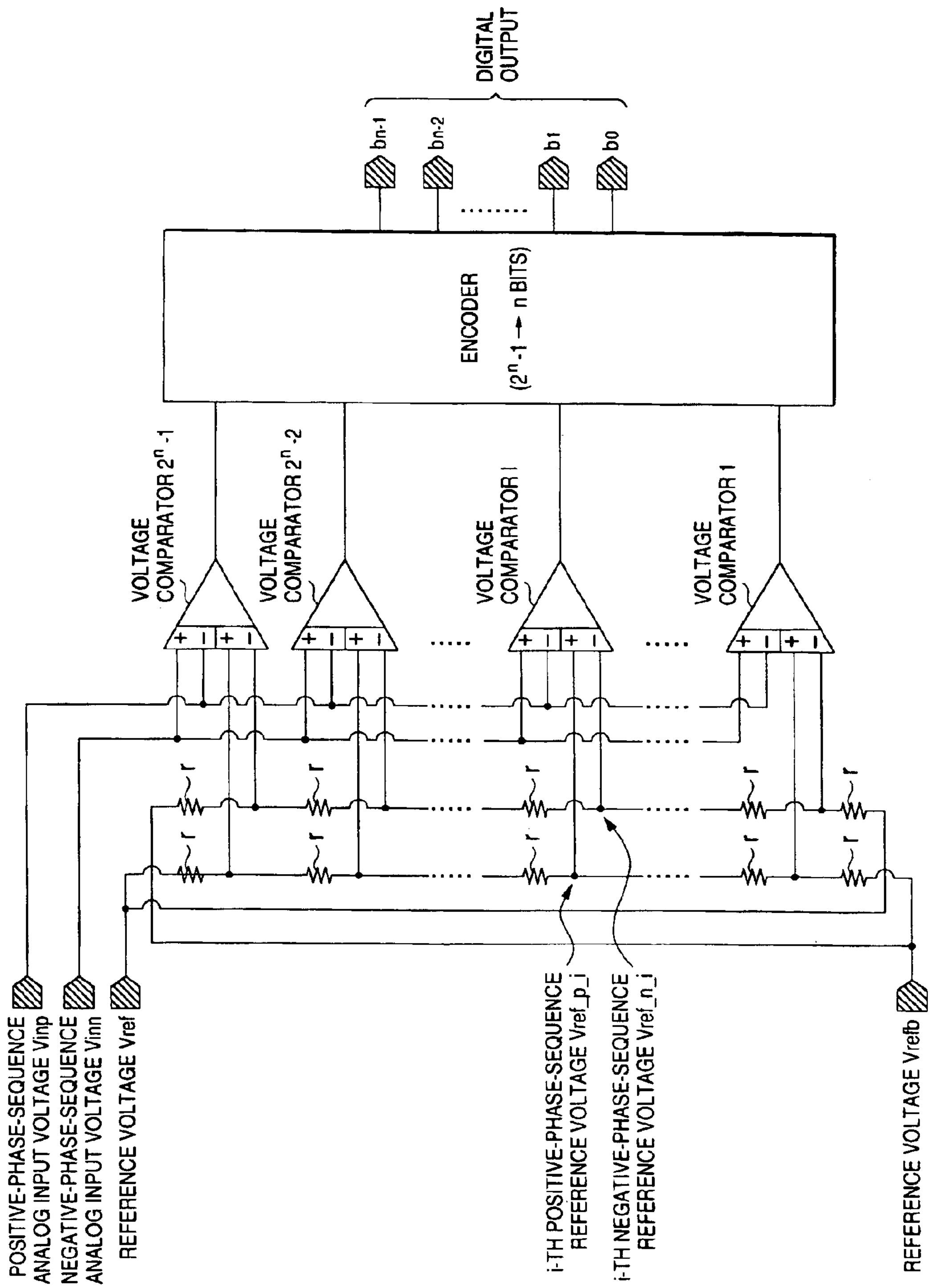
FIG. 12 is a circuit diagram of a completely differential flash-type AD converter previously studied by the present inventors based on the literature 1.

FIG. 12 is a circuit diagram of a completely differential flash-type AD converter previously studied by the present inventors based on the literature 1. This AD converter executes the operation of comparison based on the following formula. If the positive-phase input voltage is denoted by Vinp, negative-phase input voltage by Vinn, i-th reference voltage for positive phase by Vrefpi and reference voltage for negative phase by Vrefni, then, the comparison operation of the i-th comparator is given by, $$?((Vinp-Vinn)>(Vrefpi-Vrefni)) \tag{10}$$

That is, each comparator compares the difference between the positive-phase input voltage and the negative-phase input voltage, with the difference between the positive-phase reference voltage and the negative-phase reference voltage. The AD converter of FIG. 12 complies with the above formula (10).

Figure 13:
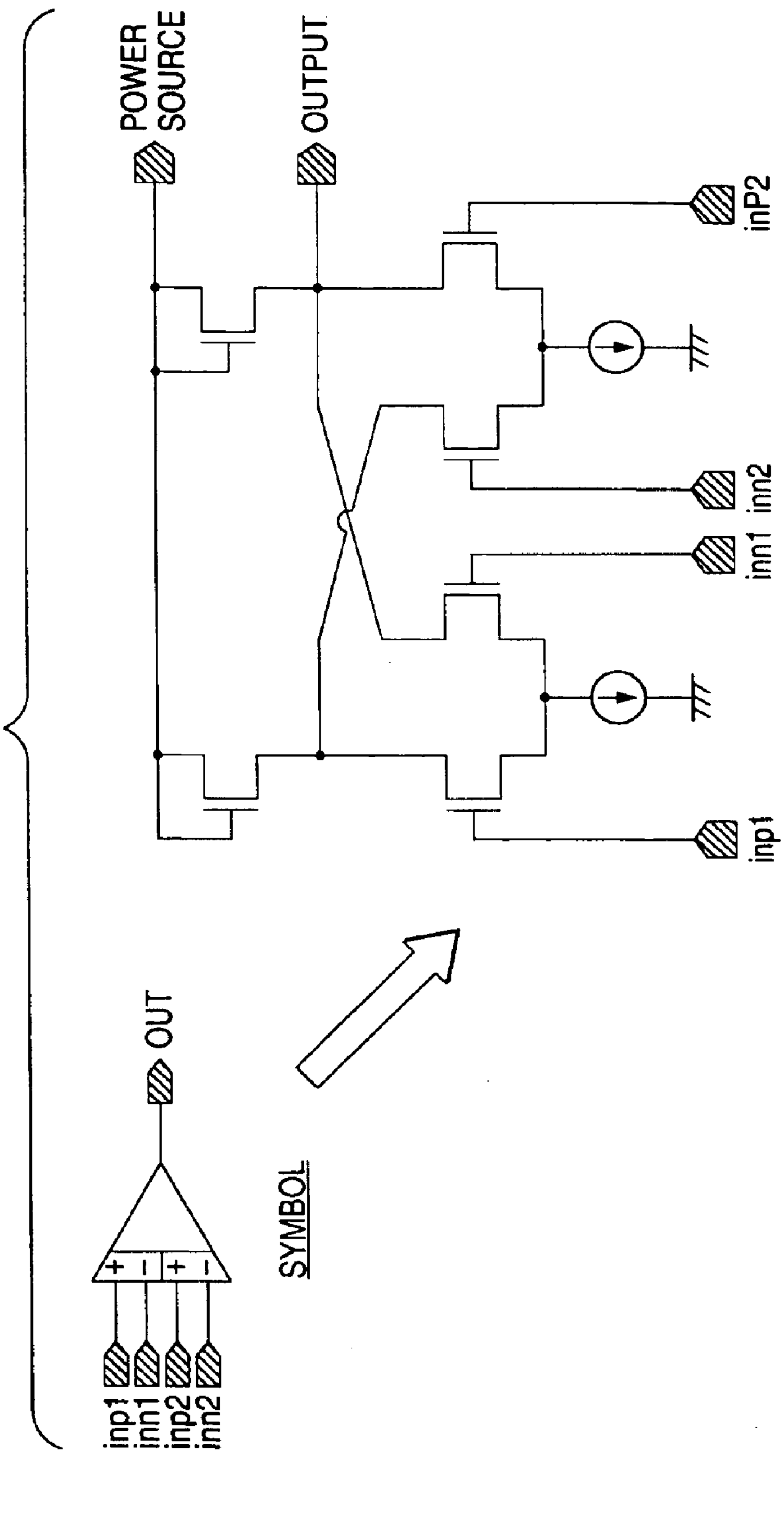
FIG. 13 is a circuit diagram of a voltage comparator needed for the AD converter of FIG. 12.

The AD converter of FIG. 12 involves a problem described below. The voltage comparator has four inputs. Therefore, the four-input amplifiers and voltage comparators shown in, for example, FIG. 13 must be used. The circuit of FIG. 13 has a function for amplifying a difference in the input voltage between the terminals inp1 and inn1, for amplifying a difference in the input voltage between the terminals inp2 and inn2, or for judging which is larger between them.

In the AD converter of FIG. 12, the amplitude is great at a decision point of a comparator close to the end of the resistor ladder, and it is necessary to examine which one of the signals having the same code is larger. Namely, it is necessary to judge which is larger between "Vinp−Vinn" and "Vrefpi−Vrefni". A differential amplifier circuit is usually used for the input stage of the voltage comparator. When the input amplitude is great, however, the circuit is saturated, and it becomes difficult to precisely judge which one is larger.

The above formula (10) can be modified to be, $$?((Vinp-Vrefpi)>(Vinn-Vrefni)) \tag{11}$$

In FIG. 12, Vinp−Vrefpi may be operated by feeding Vinp and Vrefpi to the inputs + and − on the one side of the 4-input voltage comparators, and Vinn−Vrefni may be operated by feeding Vinn and Vrefni to the inputs + and − on the other side thereof, to compare which is larger. The AD converter of the literature 1 employs the above constitution.

Concerning the decision point, the AD converter that executes the comparison operation ?((Vinp−Vrefpi)>(Vinn Vrefni)) is free from the problem of the AD converter of FIG. 12. Instead, however, the same-phase voltages input to the voltage comparators are different every voltage comparator. Therefore, there arouses the same problem as the one described above in connection with the single end type flash AD converter; i.e., it is necessary to use voltage comparators having a wide range of same-phase input voltages.

Figure 11:
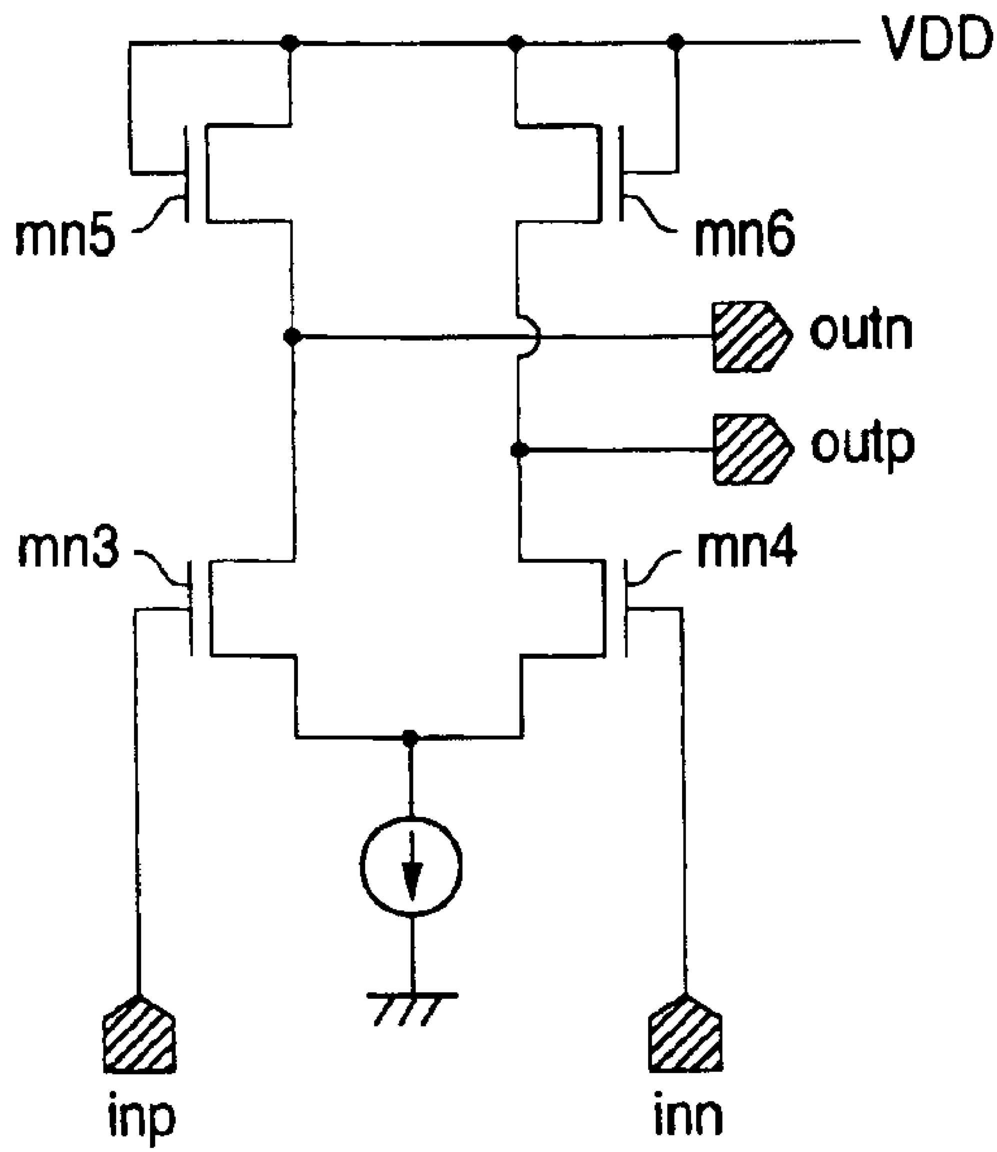
FIG. 11 is a circuit diagram illustrating an embodiment of a voltage comparator circuit used for the completely differential type AD converter according to the invention.

In the AD converter of the completely differential constitution of FIG. 9, the voltage comparators execute the comparison operations expressed by the following formulas. Comparators:

If this is compared to the completely differential AD converter shown in FIG. 12, the results become as described below. Namely, the voltage comparators need have two inputs. Namely, the voltage comparator can be constituted, as shown in FIG. 11, by differential MOS transistors mn3, mn4, by load MOS transistors mn5, mn6, and a constant-current source (bias current source) provided for the sources connected in common of the differential MOS transistors mn3 and mn4, featuring simplified circuitry. That is, in a 6-bit AD converter, for example, the voltage comparators, in the case of the mid-riser system, are required in a number of $2^6-1=64-1=63$ so as to be corresponded to the connection points of the resistor ladder. Namely, the circuitry is greatly simplified, and the electric power is consumed in decreased amounts.

Further, the input signals have large amplitudes, and there is no need of comparing the signals of the same code. The input to the voltage comparator is a differential signal. Therefore, one signal has a polarity which is always opposite to that of the other signal. The decision points of the voltage comparators are the same-phase voltages (=(Vinp+Vinn)/2) of the signals, and are the same for all comparators. As described above, the constitution of this invention is effective even for the completely differential AD converter.

The completely differential AD converter, too, can be constituted in either the mid-treated system or the mid-riser system as described above. Namely, the embodiment of FIG. 9 is corresponding to the mid-riser system.

Figure 10:
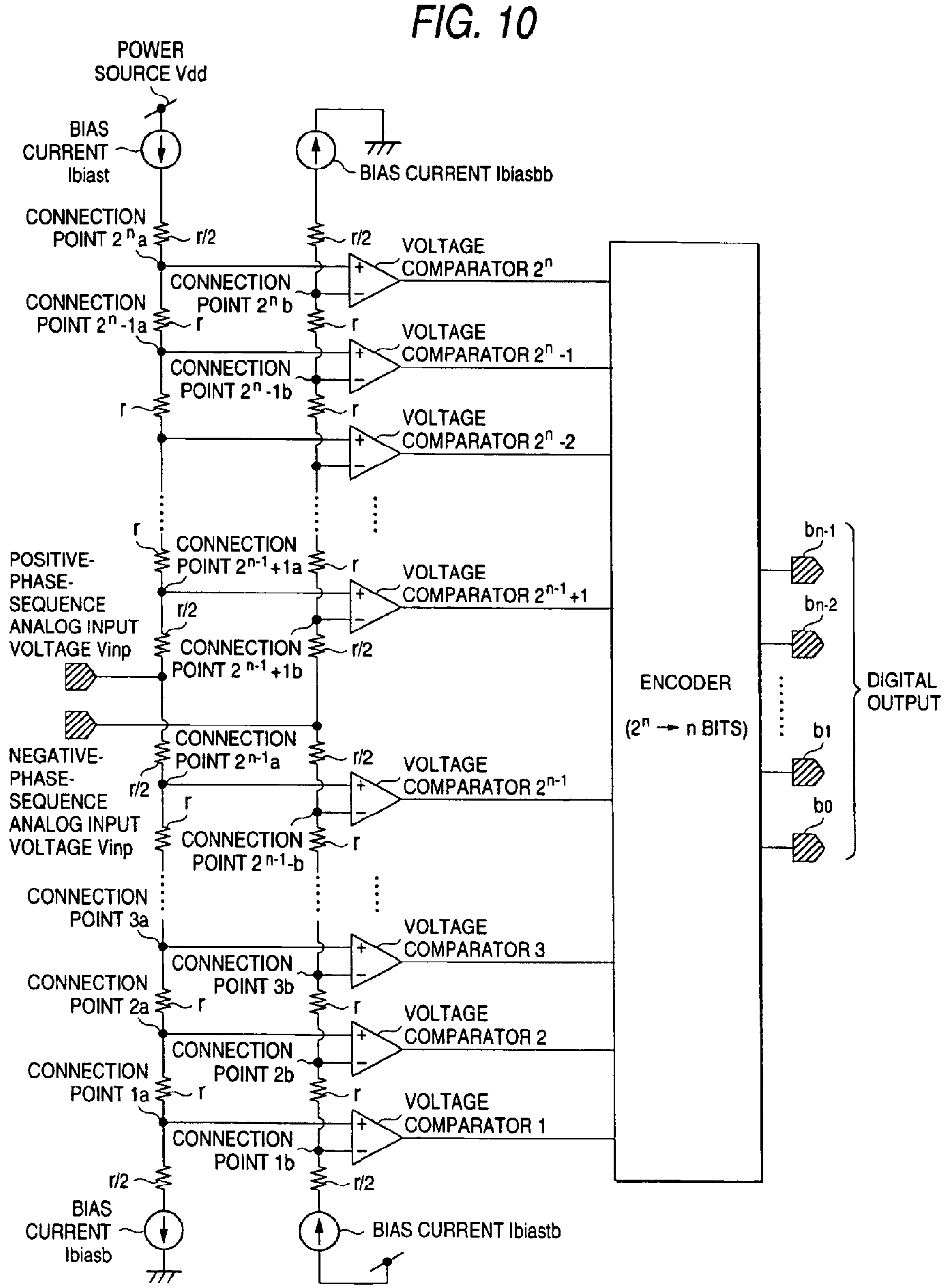
FIG. 10 is a circuit diagram illustrating a further embodiment of a completely differential type AD converter according to the invention.

FIG. 10 is a circuit diagram illustrating a further embodiment of a completely differential type AD converter according to the invention. The AD converter of this embodiment is designed for the mid-tread system described above. The mid-tread system requires the comparators in an number of $2^n$ which is larger by one than that for the mid-riser system.

The two resistor ladders of this embodiment are provided at both ends thereof with resistor elements having a resistance r/2 which is one-half the resistance of the unit resistor element r. The input terminals that receive the positive-phase analog input voltage Vinp and the negative-phase analog input voltage Vinn are provided at connection points where the unit resistor element r is divided into r/2 like in the case of the single end type described above. In the example of FIG. 10, the positive-phase and negative-phase input terminals are provided at connection points at where the unit resistor elements provided between the connection point $2^{n-1}$a and the connection point $2^{n-1}$1a and between the connection point $2^{n-1}$b and the connection point $2^{n-1}$+1b are divided into r/2, respectively.

Described below are the actions and effects obtained from the above examples.

(1) A plurality of voltage comparators compare a reference voltage with voltages at connection points of a resistor ladder constituted by connecting a plurality of resistor elements in series, a first current circuit (blow-out type constant-current circuit) is provided on the high potential side of the resistor ladder, a second current circuit (suction type constant-current circuit) is provided on the low potential side thereof, and an analog input voltage is fed by providing an input terminal at any place except both ends of the resistor ladder, eliminating the buffer for receiving the input signals, or using the buffer having relaxed requirements for the range of input signals and the output impedance thereof.

(2) In addition to the above, the first current circuit and the second current circuit connected to both ends of the resistor ladder can be set to flow the same current maintaining high precision by utilizing current mirror circuits.

(3) In addition to the above, the resistor ladder can be constituted by using unit resistor elements of a number of $2^n$, the voltage comparator may be used in a number of $2^n-1$ to correspond to the connection points where the unit resistor elements are connected to each other, and n-bit digital signals may be formed by the mid-riser system.

(4) In addition to the above, the resistor ladder is constituted by unit resistor elements of a number of $2^n$, a half of the unit resistor element is provided at both ends thereof, the unit resistor element on where the input terminal is to be provided is divided into one-half to form a neutral point except both ends, the voltage comparators are used in a number of $2^n$ to correspond to the connection points at where the resistors attached to both ends and the unit resistor elements are connected to each other, so as to form n-bit digital signals by the mid-tread system.

(5) In addition to the above, the input terminal is provided at the center of the resistor ladder or at a point of mutual connection near the center, in order to input a maximum of signal amplitude even at a low power source voltage while maintaining the operation margin of the circuit.

(6) In addition to the above, a capacitor element is provided between the input terminal and the connection point where the resistor ladders are connected to each other to quicken a change of the signals even at the connection points remote from the input terminal and to widen the band for the input signals.

(7) In addition to the above, the input terminal is provided with a track-holding circuit to prevent a deviation in the timings of comparison of the voltage comparators caused by a clock skew at the time of handling high-speed input signals.

(8) In addition to the above, the resistor ladder is constituted by a resistor ladder of the positive-phase side which receives a positive-phase analog input voltage through the input terminal thereof and a resistor ladder of the negative-phase side which receives a negative-phase analog input voltage through the input terminal thereof. The voltage comparators compare the voltages at the connection points of the resistor ladder of the positive-phase side with the voltages at the connection points which are symmetrical to the neutral point of the resistor ladder of the negative-phase side, making it possible to obtain a completely differential AD converter featuring simple constitution and low power consumption.

(9) Voltage comparators of a number of $2^n-1$ compare the voltages at connection points of the first resistor ladder constituted by resistor elements of a number of $2^n$ with the voltages at connection points which are symmetrical with respect to a neutral point of the second resistor ladder, blow-out type constant-current circuits are provided on the high potential sides of the first and second resistor ladders, suction type constant-current circuits are provided on the low potential sides of the first and second resistor ladders, a positive-phase analog input voltage is fed to a first input terminal provided at the center of the first resistor ladder or at a connection point near the center thereof, and a negative-phase analog input voltage is fed to a second input terminal provided at the center of the second resistor ladder or at a connection point near the center thereof, making it possible to obtain a completely differential AD converter featuring simple constitution and low power consumption.

Though the invention accomplished by the present inventors was concretely described above by way of embodiments, it should be noted that the invention is in no way limited to the above embodiments only but can be modified and changed in a variety of ways without departing from the spirit and scope of the invention. For example, the blow-out type constant-current circuit on the high potential side of the resistor ladder and the suction type constant-current circuit on the low potential side can be constituted in a variety of embodiments. This invention can be widely utilized as AD converters for use in the digital signal-processing integrated circuits such as those for reproducing the initial data sequence from the signals picked up by a magnetic head or an optical pickup through the digital signal processing while removing such effects as interference among the codes in a disk data storage system such as HDD or DVD, or can be used as AD converters for which high-speed operation is required.

Briefly described below is the effect obtained by a representative example of the inventions disclosed in this application. Voltages at the connection points of a resistor ladder in which a plurality of resistor elements are connected in series, are compared with a reference voltage by a plurality of voltage comparators, a first current circuit is provided on the high potential side of the resistor ladder, a second current circuit is provided on the low potential side thereof, and analog input voltages are fed by providing an input terminal at any place of the resistor ladder except both ends thereof. Therefore, no buffer is required for receiving the input signals. Or, the buffer needs have relaxed requirements for the range of input signals and for the output impedance.

What is claimed is:

1. An AD converter comprising:

a resistor ladder including a plurality of resistor elements connected in series between a high potential node and a low potential node;

a plurality of voltage comparators that compare a reference voltage with voltages at connection points where the resistor elements of the resistor ladder are connected to each other;

a first current circuit coupled to a high potential side of the resistor ladder;

a second current circuit coupled to a low potential side of the resistor ladder; and an input terminal provided at one of the connection points to receive an analog input voltage.

2. An AD converter according to claim 1, wherein a current value of the first current circuit and a current value of the second current circuit are set to be equal to each other by current mirror circuits.

3. An AD converter according to claim 1, wherein the resistor ladder is constituted by $2^n$ resistor elements, and there are $2^n-1$ voltage comparators corresponding to the connection points where the resistor elements are connected to each other, thereby to form n-bit digital signals.

4. An AD converter comprising:

a resistor ladder including a plurality of unit resistor elements connected in series between a high potential node and a low potential node;

a plurality of voltage comparators that compare a reference voltage with voltages at connection points where the unit resistor elements of the resistor ladder are connected to each other;

a first current circuit coupled to a high potential node of the resistor ladder and a second current circuit connected to a low potential node of the resistor ladder; and an input terminal provided at one of the connection points to receive an analog input voltage, wherein the resistor ladder includes $2^n$ unit resistor elements, and resistor elements at both ends of the resistor ladder have a resistance value one-half of the resistance value of a unit resistor element, wherein there are $2^n$ voltage comparators corresponding to the connection points where the unit resistor elements and the resistor elements at both ends of the resistor ladder are coupled, thereby to form n-bit digital signals.

5. An AD converter according to claim 1, wherein the input terminal is provided at a center of the resistor ladder or at the connection point near the center thereof.

6. An AD converter according to claim 1, wherein a capacitor element is provided between the input terminal and a predetermined connection point of the resistor ladder.

7. An AD converter according to claim 1, wherein a track-holding circuit is provided for the input terminal.

8. An AD converter comprising:

a first resistor ladder including $2^n$ unit resistor elements coupled in series between a high potential side and a low potential side;

a second resistor ladder including $2^n$ unit resistor elements coupled in series between the high potential side and the low potential side;

$2^n-1$ comparators;

first connection points where the unit resistor elements of the first resistor ladder are coupled to each other;

second connection points where the unit resistor elements of the second resistor ladder are coupled to each other;

a first current circuit coupled to the high potential side of the first resistor ladder;

a second current circuit coupled to the low potential side of the first resistor ladder;

a third current circuit coupled to the high potential side of the second resistor ladder; and a fourth current circuit coupled to the low potential side of the second resistor ladder;

wherein there are $2^n-1$ first connection points, wherein there are $2^n-1$ second connection points, wherein the k-th comparator ($1 \leqq k \leqq 2^n-1$) compares the k-th first connection point counted from the high potential side of the first resistor ladder with the k-th second connection point counted from the low potential side of the second resistor ladder, wherein the first resistor ladder includes a positive-phase analog input terminal at a predetermined place of the first connection point, and wherein the second resistor ladder includes a negative-phase analog input terminal at a predetermined place of the second connection point; thereby to form n-bit digital signals.

9. An AD converter according to 8, wherein a current value of the first current circuit and a current value of the second current circuit are set to be equal to each other by current mirror circuits, and wherein a current value of the third current circuit and a current value of the fourth current circuit are set to be equal to each other by current mirror circuits.

10. AD converter according to claim 8, wherein the positive phase analog input terminal is the $2^{n-1}$-th second connection point counted from the high potential side of the first resistor ladder, and wherein the negative phase analog input terminal is the $2^{n-1}$-th second connection point counted from the high potential side of the second resistor ladder.

* * * * *